United States Patent
Lubomirsky et al.

(10) Patent No.: US 9,646,807 B2
(45) Date of Patent: May 9, 2017

(54) SEALING GROOVE METHODS FOR SEMICONDUCTOR EQUIPMENT

(71) Applicant: Applied Materials, Inc., Santa Clara, CA (US)

(72) Inventors: Dmitry Lubomirsky, Cupertino, CA (US); Qiwei Liang, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 323 days.

(21) Appl. No.: 14/456,146

(22) Filed: Aug. 11, 2014

(65) Prior Publication Data

US 2015/0047786 A1    Feb. 19, 2015

Related U.S. Application Data

(60) Provisional application No. 61/866,802, filed on Aug. 16, 2013.

(51) Int. Cl.

| | |
|---|---|
| *C23C 16/00* | (2006.01) |
| *B43M 3/00* | (2006.01) |
| *F16L 39/00* | (2006.01) |
| *F16L 41/00* | (2006.01) |
| *F16L 45/00* | (2006.01) |
| *F16L 51/00* | (2006.01) |
| *H01J 37/32* | (2006.01) |

(52) U.S. Cl.
CPC .. *H01J 37/32816* (2013.01); *H01J 37/32513* (2013.01); *Y10T 428/24479* (2015.01)

(58) Field of Classification Search
CPC .................................................. F16L 41/021
USPC ................. 118/733; 156/441.5; 285/133.21
See application file for complete search history.

(56) References Cited

U.S. PATENT DOCUMENTS

| 1,303,090 | A | * | 5/1919 | McCray | ............... B26B 23/00 30/308.3 |
|---|---|---|---|---|---|
| 2,889,183 | A | * | 6/1959 | Peras | ................. F16J 15/3204 277/437 |
| 4,264,009 | A | * | 4/1981 | Tattam | .................. B65D 5/302 206/1.5 |
| 4,400,137 | A | * | 8/1983 | Miller | ..................... F01D 5/326 29/889.1 |
| 4,564,732 | A | * | 1/1986 | Lancaster | ............... B41J 5/105 200/293 |
| 4,632,060 | A | * | 12/1986 | Goto | ...................... C30B 25/14 118/715 |

(Continued)

FOREIGN PATENT DOCUMENTS

| JP | 3988557 B2 | 10/2007 |
|---|---|---|
| KP | 10-1248382 B1 | 4/2013 |
| WO | WO-2009056807 A1 | 5/2009 |

OTHER PUBLICATIONS

PCT International Search Report and Written Opinion of, PCT/US2014/050008, dated Nov. 27, 2014. The PCT Search Report is being used as the English translation for foreign reference, KR 10-1248382.

*Primary Examiner* — Keath Chen
(74) *Attorney, Agent, or Firm* — Patterson + Sheridan, LLP

(57) ABSTRACT

In one embodiment, a surface having a sealing groove formed therein. The sealing groove is configured to accept an elastomeric seal. The sealing groove includes a first portion having a full dovetail profile and at least on a second portion having a half dovetail profile.

20 Claims, 3 Drawing Sheets

(56) References Cited

U.S. PATENT DOCUMENTS

| | | | |
|---|---|---|---|
| 5,050,534 A * | 9/1991 | Yates | C23C 16/45578 118/715 |
| 5,080,556 A * | 1/1992 | Carreno | F16J 15/442 277/590 |
| 6,189,821 B1 * | 2/2001 | James | B02C 7/12 241/297 |
| 6,245,149 B1 * | 6/2001 | de Lomenie | C23C 16/4405 118/715 |
| 6,371,685 B1 * | 4/2002 | Weems | B23P 6/04 403/374.1 |
| 2002/0000252 A1 * | 1/2002 | Rosseel | B29C 49/54 137/587 |
| 2009/0066038 A1 | 3/2009 | Shojima et al. | |
| 2012/0299252 A1 | 11/2012 | Singh | |

* cited by examiner

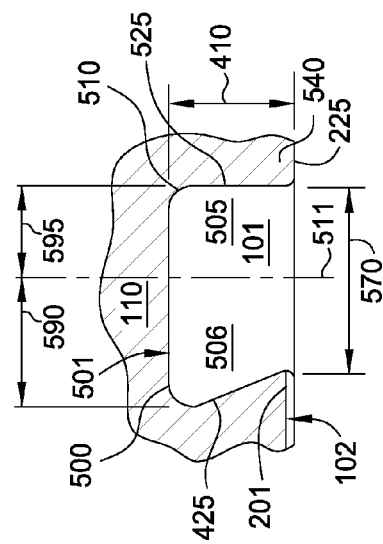
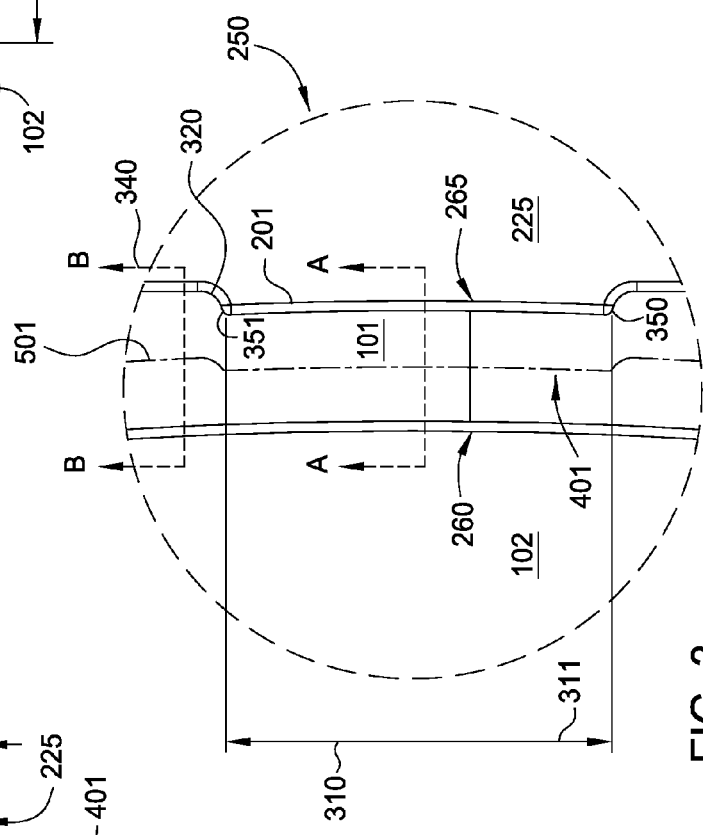
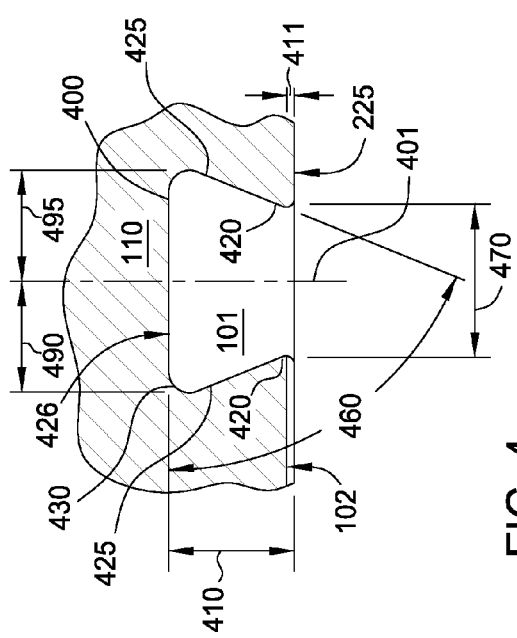

SEALING GROOVE METHODS FOR SEMICONDUCTOR EQUIPMENT

CROSS-REFERENCE TO RELATED APPLICATIONS

This application claims benefit of U.S. Provisional Patent Application Ser. No. 61/866,802, filed Aug. 16, 2013, which is incorporated by reference in its entirety.

BACKGROUND

Field

Embodiments disclosed herein generally relate to an apparatus and method for sealing a vacuum processing chamber. More particularly, embodiments herein relate to sealing technology for vacuum processing chambers.

Description of the Related Art

In the process of fabricating modern semiconductor integrated circuits (ICs), it is necessary to develop various material layers over previously formed layers and structures. The fabrication processes often involves multiple tightly controlled steps in various vacuum processing chambers before an IC is completely formed. The chamber gasses are evacuated to tightly control plasma processes and remove contaminants from within the vacuum processing chambers. Thus the vacuum processing chambers, such as plasma-assisted etching, chemical vapor deposition (CVD), physical vapor deposition (PVD), load lock, and transfer chambers and the like, are designed to operate under vacuum conditions. The vacuum processing chambers have seals along an opening, or connected surface, to keep outside air from being drawn into the vacuum processing chamber as vacuum is drawn and a negative pressure is maintained inside the vacuum processing chamber.

Some vacuum processing chambers, such as plasma processing chambers, operate at elevated temperatures. For example, the deposition of silicon and etching of metals typically occur with very high chamber temperatures. These high temperatures in the plasma chamber cause thermal expansion of chamber components and may contribute to chamber vacuum seal failure. Seal failure damages the seal itself, thus requiring costly chamber down time to allow for seal replacement. Some chamber manufactures utilize a large seal groove to mitigate seal issues at high temperatures. However, at lower temperatures, the O-rings tend to fall out of the oversized seal grooves.

Therefore there is a need for improved sealing technology suitable for use in a vacuum processing system.

SUMMARY

The embodiments described herein generally relate to a sealing groove suitable for use at elevated temperatures. In some embodiments, the sealing groove is particularly suitable for use in a vacuum processing chamber and the like.

In one embodiment, a surface has a sealing groove formed therein. The sealing groove is configured to accept an elastomeric seal. The sealing groove includes a first portion having a full dovetail profile and at least on a second portion having a half dovetail profile.

In another embodiment, a vacuum processing chamber includes a chamber body with a bottom, and side walls, a lid assembly moveable between an open and a closed position; and a sealing groove formed in one of the lid assembly and chamber body. The sealing groove configured to accept an elastomeric seal and includes a first portion having a full dovetail profile and at least on a second portion having a half dovetail profile.

In yet another embodiment, a sealing groove is disposed in a surface. The sealing groove includes a first portion having a full dovetail profile and at least on a second portion having a half dovetail profile.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is an enlarged partial top view of the sealing groove shown in FIG. 2;

FIG. 4 is a sectional view of the sealing groove and taken along section line A-A of FIG. 3; and FIG. 5 is a sectional view of the sealing groove and taken along section line B-B of FIG. 3.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to seal technology for enabling pressure control in vacuum processing chambers over wide operating temperature ranges. The seal technology described herein includes a sealing groove which accommodates seal expansion while being able to retain the seal in the groove at both low and high temperature conditions. Although the sealing groove is disclosed utilized in a vacuum processing chamber, the sealing groove may be utilized to retain a seal between other surfaces, particularly in applications where the seal is exposed to elevated temperatures.

A variety of vacuum processing chambers may be modified to incorporate the sealing groove described herein. For example, the sealing groove of the present invention may be used in a chemical vapor deposition (CVD) chamber, physical vapor deposition (PVD) chamber, etch chamber, annealing chamber, furnace, plasma treating chambers, transfer chambers, load lock chambers and implantation chambers, among others.

Figure 1:
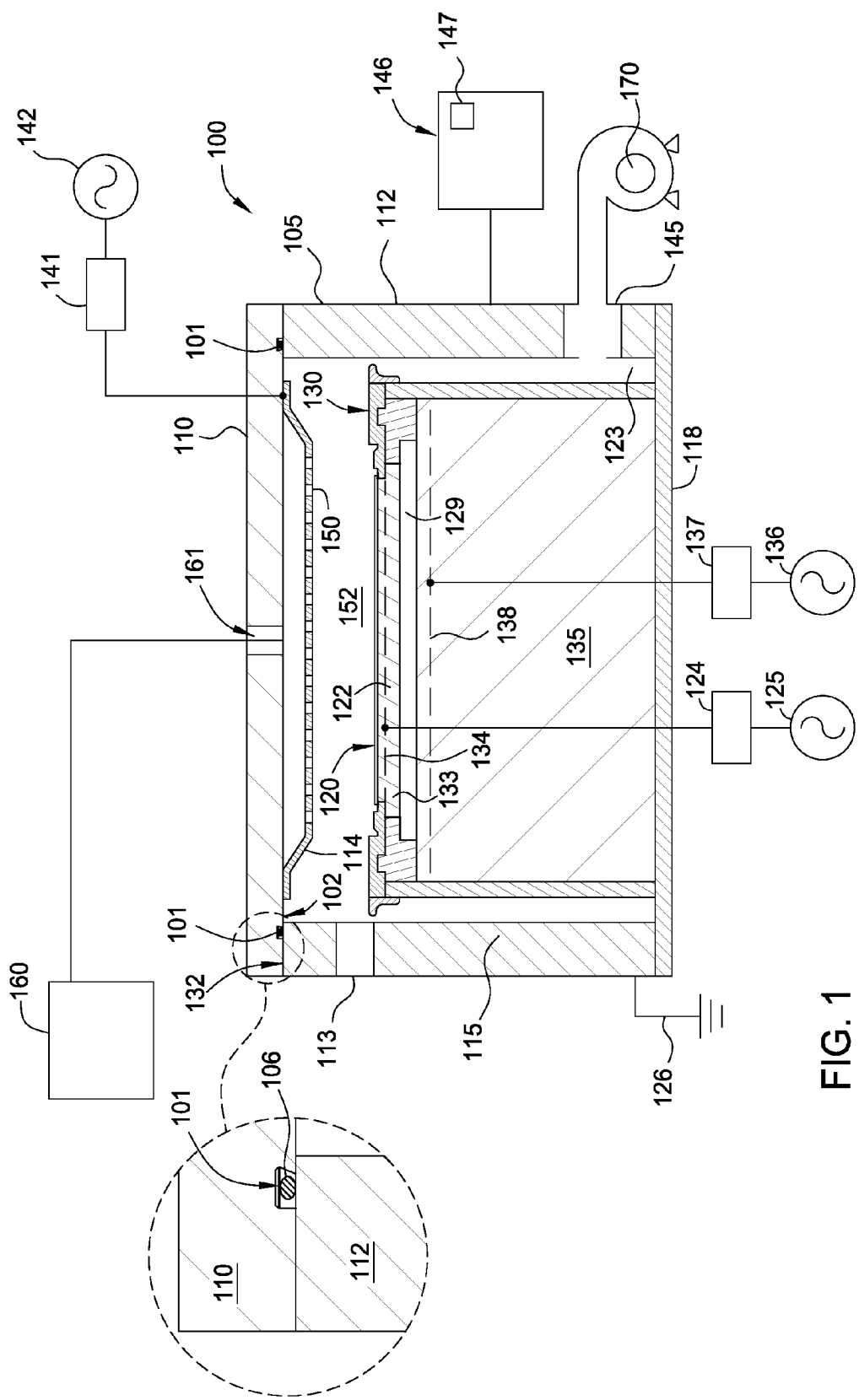
FIG. 1 is a cross-sectional view of an exemplary a vacuum processing chamber in having one embodiment of a sealing groove.

FIG. 1 illustrates an exemplary vacuum processing chamber 100 having a sealing groove 101. The exemplary vacuum processing chamber 100 is configured as an etch processing chamber and is suitable for removing one or more material layers from a substrate. The vacuum processing chamber 100 includes a chamber body 105 enclosed by a chamber lid assembly 110 and defining a processing chamber volume 152 therein. The chamber body 105 has sidewalls 112 and a bottom 118 which may be coupled to a ground 126. The sidewalls 112 have a top surface 132. The dimensions of the chamber body 105 and related components of the vacuum processing chamber 100 are not limited and generally are proportionally larger than the size of a substrate 120 to be processed. Examples of substrate sizes include, among others, substrates 120 with a 150 mm diameter, 200 mm diameter, 300 mm diameter and 450 mm diameters, among others.

The chamber body 105 may be fabricated from aluminum or other suitable materials. A substrate access port 113 is formed through the sidewall 112 of the chamber body 105, facilitating the transfer of a substrate 120 into and out of the vacuum processing chamber 100. The access port 113 may be coupled to a transfer chamber and/or other chambers of a substrate processing system (both not shown).

A gas source 160 provides process gases into the processing chamber volume 152 through an inlet 161 formed through the chamber body 105 or lid assembly 110. In one or more embodiments, process gases may include etchants and passivation gases.

A showerhead 114 may be coupled to the lid assembly 110. The showerhead 114 has a plurality of gas delivery holes 150 for distributing process gases entering the chamber volume 152 through the inlet 161. The showerhead 114 may be connected to an RF power source 142 through a match circuit 141. The RF power provided to the showerhead 114 energizes the process gases exiting the showerhead 114 to form plasma within the processing chamber volume 152.

A substrate support pedestal 135 is disposed below the showerhead 114 in the processing chamber volume 152. The substrate support pedestal 135 may include an electro-static chuck (ESC) 122 for holding the substrate 120 during processing. The ring assembly 130 is disposed on the ESC 122 and along the periphery of the substrate support pedestal 135. The ring assembly 130 is configured to control the distribution of etching gas radicals at the edge of the substrate 120, while shielding the top surface of the substrate support pedestal 135 from the plasma environment inside the vacuum processing chamber 100.

The ESC 122 is powered by an RF power source 125 integrated with a match circuit 124. The ESC 122 comprises an electrode 134 embedded within a dielectric body 133. The RF power source 125 may provide a RF chucking voltage of about 200 volts to about 2000 volts to the electrode 134. The RF power source 125 may also be coupled to a system controller for controlling the operation of the electrode 134 by directing a DC current to the electrode for chucking and de-chucking the substrate 120.

A cooling base 129 is provided to protect the substrate support pedestal 135 and assists in controlling the temperature of the substrate 120. The cooling base 129 and ESC 122 work together to maintain the substrate temperature within the temperature range required by the thermal budget of the device being fabricated on the substrate 120. The ESC 122 may include heaters for heating the substrate, while the cooling base 129 may include conduits for circulating a heat transfer fluid to sinking heat from the ESC 122 and substrate disposed thereon. For example, the ESC 122 and cooling base 129 may be configured to maintain the substrate 120 at a temperature of about minus 25 degrees Celsius to about 100 degrees Celsius for certain embodiments, at a temperature of about 100 degrees Celsius to about 200 degrees Celsius temperature range for other embodiments, and at about 200 degrees Celsius to about 500 degrees Celsius for yet still other embodiments. In one embodiment, the substrate 120 temperature is maintained at 15 to 40 degrees Celsius by the ESC 122 and cooling base 129.

Lift pins (not shown) are selectively moved through the substrate support pedestal 135 to lift the substrate 120 above the substrate support pedestal 135 to facilitate access to the substrate 120 by a transfer robot or other suitable transfer mechanism.

A cathode electrode 138 is disposed in the substrate support pedestal 135 and connected to an RF power source 136 through an integrated match circuit 137. The cathode electrode 138 capacitively couples power to the plasma from below the substrate 120. In one embodiment, the RF power source 136 provides the cathode electrode 138 with between about 200 W to about 1000 W of RF power.

A pumping port 145 may be formed through the sidewall 112 of the chamber body 105 and connected to the chamber volume through the exhaust manifold 123. A pumping device 170 is coupled to the processing chamber volume 152 through the pumping port 145 to evacuate and control the pressure therein. The exhaust manifold 123 has a baffle plate 154 to control the uniformity of the plasma gas drawn into the exhaust manifold 123 from the pumping device 170. The pumping device 170 may include one or more pumps and throttle valves. The pumping device 170 and chamber cooling design enables high base vacuum (about $1 \times E^{-8}$ Torr or less) and low rate-of-rise (about 1,000 mTorr/min) at temperatures suited to thermal budget needs, e.g., about −25 degrees Celsius to about +500 degrees Celsius. In one embodiment, the pumping device enables a vacuum pressure between 10 and 30 mT.

During processing, gas is introduced into the vacuum processing chamber 100 to form a plasma and etch the surface of the substrate 120. The substrate support pedestal 135 is biased by the power source 136. Power source 142 energizes the process gas, supplied by the gas source 160, leaving the showerhead 114 to form the plasma. Ions from the plasma are attracted to the cathode in the substrate support pedestal 135 and bombard/etch the substrate 120 until a desired structure is formed.

The lid assembly 110 is moveable between an open position and a closed position to facilitate service to the interior of the vacuum processing chamber 100. One of the lid assembly 110 and the chamber body 105 includes one or more sealing grooves 101. The sealing groove 101, shown formed in a bottom surface 102 of the lid assembly 110, has a seal 106 disposed therein. The seal 106 may be an O-ring or other suitable seal, the material of which is selected for the expected process conditions. When the lid assembly 110 is in the open position, a portion of the seal 106 extends below the bottom surface 102 of the lid assembly 110. When the lid assembly 110 is moved into the closed position, the seal 106 is compressed between the top surface 132 of the chamber body 105 and the lid assembly 110, thereby sealing the lid assembly 110 to the chamber body 105. The compression of the seal 106 is sufficient to prevent the flow of gas from outside the chamber body 105 from entering the processing chamber volume 152 when vacuum conditions are present within the chamber volume 152.

The configuration of the sealing groove 101 in the lid assembly 110 may be selected in response to the processing parameters utilized to etch a particular material disposed on the substrate 120, which governs the selection of the material and geometry for the seal 106. The configuration of the sealing groove 101 permits the Seal 106 to thermally expand and contract without extruding from the sealing groove 101 while maintaining 10 mTorr to about 30 mTorr of pressure at about 40 degrees Celsius or greater. The robust seal between the chamber body 105 and the lid assembly 110, provided by the combination of the sealing groove 101 and the seal 106, allows a wider window for the plasma processes which prevent contamination associated with seal failure. To better understand how the function of sealing groove 101 enables chamber operation at elevated temperatures, the sealing groove 101 is described in greater detail with reference to FIG. 2.

Figure 2:
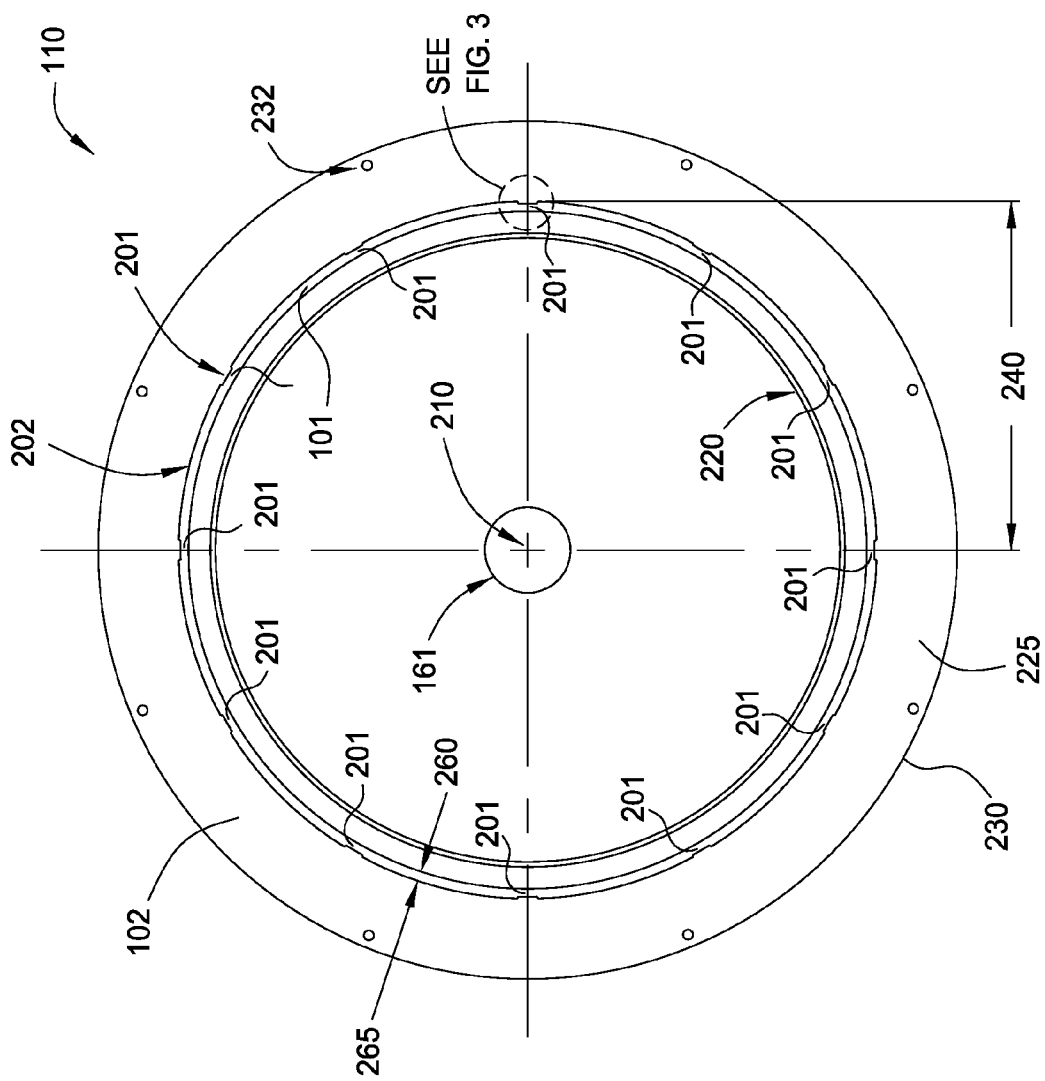
FIG. 2 is a bottom view of a lid of the vacuum processing chamber, containing the sealing groove.

FIG. 2 is a view of the lid bottom 102, illustrating the sealing groove 101. The lid bottom 102 has a center 210 about which an outside edge 230 and outer edge 220 are concentrically aligned. An outer surface 225 of the lid assembly bottom 122 between the outer edge 220 and outside edges 230 may be flat to receive the sealing groove 101. The sealing groove 101 is formed into the outer surface 225 in a location that aligns the sealing groove 101 with the top 132 of the chamber body 105 (as shown in FIG. 1) so that the seal 106, retained in the sealing groove 101, compresses between the lid assembly 110 and the chamber body 105 when the lid assembly 110 is in the closed position.

The outer surface 225 may include through holes 232 near the outside edge 230. Through holes 232 accepts a fastener and aligns with a fastener receiver (not shown) deposed in the top 122 of the sidewalls 112. The fasteners may be used to secure the lid assembly 110 to the chamber body 105. In one embodiment, there are 8 evenly spaced through holes 232 in the outer surface 225.

The sealing groove 101 may be circular and concentrically aligned with the lid bottom 102. The sealing groove 101 may have a radius 240 measured from the center 210 to an outer perimeter 265 of the sealing groove 101. Alternatively, the sealing groove 101 may be other plan view geometries. For instance, the sealing groove 101 may have square, rectangular, octagonal, polygonal, or other plan view form suitable for aligning with the sidewalls of the substrate chamber.

The sealing groove 101 has an inner perimeter 260, proximate the center 210, and the outer perimeter 265, nearer to the outer edge 220, both of which are concentric about the center 210. The inner perimeter 260 is circular in shape while the outer perimeter 265 is mostly circular with one or more small tabs 201 extending into the sealing groove 101. The outer perimeter 265 may have an outer diameter that varies between about 200 mm and about 1000 mm, depending on the size of the chamber body 105 which the sealing groove 101 interfaces with. In one embodiment, the sealing groove 101 may have an outer diameter of about 500 mm and an outer perimeter 265 with a length of about 1,570 mm.

Alternately, the sealing groove 101 may have a square geometry. All four sides of the sealing groove may be of equal length that varies between about 200 mm and about 1000 mm, depending on the size of the chamber body 105 which the sealing groove 101 interfaces with. In one embodiment, the square sealing groove 101 may have a length of about 900 mm along one side and an outer perimeter 265 with a length of about 3,600 mm.

The tab 201 is a small protrusion extending from the outer perimeter 265 of the seal groove. Portions of the sealing groove 101 do not have the tab 201. For instance, an open portion 202 (i.e. portion of the sealing groove 101 unrestricted by a tab 201) is shown adjacent to tabs 201. The open portion 202 and tab 201 alternate along the outer perimeter 265 of the sealing groove 101. For example, the outer perimeter 265 of the sealing groove 101 may have 12 evenly spaced tabs 201 separated by open portions 202.

An enlarged view of the tab 201 as well as the open portion 202 is in FIG. 3. The tabs 201 may have a length 310 measured from the intersection of the tab 201 with the outer perimeter 265. The length 310 of the tab 201 may vary between about 2 mm and about 100 mm, depending on the size of the sealing groove 101, the materials of the seal, and expected operating conditions. In one embodiment, the outer perimeter 265 of the sealing groove 101 has a length of about 1,570.80 mm, the lengths 310 the tabs 201 along the outer perimeter 265 may each be about 17.44 mm while a length for each of the 12 open portions 202 between adjacent tabs 201 may be about 113 mm.

The tab 201 has a protrusion 311 that extends radially inward from the outer perimeter 265. In another embodiment, the tab 201 may have a protrusion 311 which may extend radially outward from the inner perimeter 260. The protrusion 311 of the tab 201 has a rounded curve 320 at a beginning 350 and an end 351 of the tab 201 which connects the tabs 201 to the outer perimeter 265. The rounded curve 320 breaks the sharp edge at the beginning 350 and the end 351 so as to not damage the seal 106 placed in the sealing groove 101. In one embodiment, the rounded curve 320 has a radius of about 1 mm.

FIG. 4 is a cross sectional profile of the sealing groove 101, taken along a section line A-A of FIG. 3, taken through the tabs 201. As shown in FIG. 4, the sealing groove 101 has a full dovetail profile 400 that incorporates the tab 201. The full dovetail profile 400 may be substantially symmetric about a center axis 401. The full dovetail profile 400 includes an opening 470 that breaks the bottom surface 102 of the lid assembly 110.

The opening 470 has a rounded edge 420 along the inner perimeter 260 and the outer perimeter 265. The rounded edge 420 may have a radius of about 0.38 mm. The rounded edge 420 starts at the bottom surface 102 of the lid assembly 110 and concludes at the opening 470. The opening 470 is the narrowest portion of the full dovetail profile 400. In one embodiment, the opening 470 is about 4.58 mm. However, the width of the opening 470 is dependent on the size and material selection for the seal 106. The opening 470 is selected to hold the seal 106 into the sealing groove 101 under the range of conditions and temperatures the lid assembly 110 may experience.

The full dovetail profile 400 expands below the opening 470 to include tapered walls 425. The walls 425 have an angle 460 defined with a bottom 420 of the sealing groove 101. The angle 460 of the walls 425 may be the same for both sides of the full dovetail profile 400. In one embodiment, the angle 460 may be about 60°. However, it should be appreciated that the angle 460 may vary in response to different seal profiles, among other factors.

The walls 425 intersect the bottom 426 at a bottom radius 430. The bottom radius 430 starts at a depth 530 (shown in FIG. 5) measured perpendicular to the bottom surface 102 and outer surface 225 of the lid assembly 110. The depth 530 is measured from the outer surface 225 along the outer perimeter 265. The depth 530 may vary between about 3.56 mm and about 3.64 mm. In one embodiment, the depth 530 of the sealing groove 101 is about 3.60 mm.

Along the inner perimeter 260, the bottom surface 102 is recessed below the plane formed by the outer surface 225. Therefore, when the lid assembly 110 is in a closed position, the outer surface 225 is closer than bottom surface 102 to the top 122 of the sidewall 112 to prevent the lid assembly 110 from contacting the chamber body 105 on the vacuum side of the seal thereby minimizing the potential for particle generation. In one embodiment, a difference 411 from the plane of the bottom surface 102 to the plane of the outer surface 225 may be about 0.25 mm.

The bottom radius 430 is present at both ends of the seal groove bottom 426. The bottom radius 430 may have a radius of about 0.79 mm. However, it should be appreciated that as the size of the wall 425 and bottom 426 may change, bottom radius 430 may also be different. The seal groove bottom 426 may be substantially parallel to both the bottom surface 102 and the outer surface 225. The bottom 420 may have a circular surface roughness of about 0.4 mm. A depth 410 of the bottom 426 measured from the outer surface 225 may vary between about 4.12 mm and about 4.22 mm. In one embodiment, the depth 410 of the sealing groove 101 is about 4.17 mm.

It should be appreciated that the full dovetail profile 400 of the sealing groove 101 may be substantially symmetrical about the center axis 401. The full dovetail profile 400 has the opening 470 and the bottom 426 bisected by the center axis 401. However this is not the case for the open portion 202. FIG. 5 is a cross sectional profile of the sealing groove 101 taken along section lines B-B of FIG. 3 which does not cut through tab 201. FIG. 5 illustrates a half dovetail profile 500 that the sealing groove 101 has in the open portions 202.

The half dovetail profile 500 has an opening 570 which is larger than the opening 470 of the full dovetail profile 400 shown in FIG. 4. The half dovetail profile 500 has a bottom 501 which is substantially the same as bottom 401. The bottoms 426, 501 are also ex-planar. A section line 511 is substantially perpendicular to and bisects the opening 570. However, the section line 511 is not aligned with center axis 401. The section line 511 extends through the middle of the opening 570 and to the bottom 501 dividing the bottom 501 into an x portion 590 and a y portion 595.

The half dovetail profile 500 has an outer portion 505 and an inner portion 506 defined by the partitioning of the half dovetail profile 500 by the section line 511. The inner portion 506 is substantially similar to that of the corresponding portion of the full dovetail profile 400 as shown in FIG. 4, whereas the outer portion 505 is substantially dissimilar. Therefore, unlike the full dovetail profile 400, the outer portion 505 of the half dovetail profile 500 is not symmetric with the inner portion 506.

The half dovetail profile 500 has a wall 525 which intersects the bottom 501 with a radius 510. The radius 510 is substantially similar to the bottom radius 430. In one embodiment the radius 510 is about 0.79 mm. However, instead of the both walls 425, 525 having the angle 460, the wall 525 is substantially perpendicular to the bottom surface 102 and the bottom 501 of the sealing groove 101. Thus, the half dovetail profile 500 has an x portion 490 which is larger than the x portion 490 of the full dovetail profile 400. The larger x portion 490 in the half dovetail profile 500 allows additional space in the sealing groove 101 for the Seal 106 to expand while under elevated thermal conditions. The opening 570 may vary between about 5 mm and about 12 mm in width, depending on the size of the sealing groove 101. In one embodiment, the opening 570 may be about 5.71 mm wide.

The wall 525 has a rounded edge 540 starting at the opening 570 and ending at the outer surface 225 portion of the lid assembly 110. The rounded edge 540 is substantially similar to rounded edge 420. In one embodiment the rounded edge 540 may have a radius of about 0.38 mm.

Referring to FIGS. 3, 4 and 5, the non-continuous profile for the half dovetail profile 500 (shown as section B-B) and full dovetail profile 400 (shown as section A-A) generate a series of tabs 201 and open portions 202. The tabs have substantially similar x portions 490 and y portions 495 and open portions 202 have substantially dissimilar x portions 490 and y portions 495. It should be appreciated that the half dovetail profile 500 are the open portions 202 yet determine the location of the tabs 201 on either the inner perimeter 260, the outer perimeter 265, or in some embodiments, both the inner and outer perimeter 260, 265 together. In one embodiment, the x portions 490 are greater than the y portions 495 and causes the formation of tabs 201 on the inner perimeter 260 of the sealing groove 101. In an alternate embodiment, the x portions 490 are less than the y portions 495 and causes the formation of tabs 201 on the outer perimeter 265 of the sealing groove 101.

Referring back to FIG. 2, it can now be appreciated that the tabs 201 and the open portions 202 accommodate expansion of the seal 106 while together making up a continuous profile for the sealing groove 101. The tabs 201 hold the seal 106 at the lower temperatures while the open portions 202 allow for the expansion of the seal 106 when heated. Alternately, when the seal expansion may be large, the tabs 201 and the open portions 202 may not make a continuous surface. The open portions 202 may have an even larger diameter than the tabs 201. In this manner, the seal 106 is retained in the sealing groove 101 throughout a wide temperature range, without damage, while allowing for a robust sealing of the vacuum processing chamber.

While the foregoing is directed to embodiments of the invention, other and further embodiments of the invention may be devised without departing from the basic scope thereof.

The invention claimed is:

1. A sealing groove disposed in a surface, the sealing groove comprising:
  a first portion having a full dovetail profile and at least one second portion having a half dovetail profile, the at least one second portion connects the first portion along a periphery direction of the sealing groove.

2. The sealing groove of claim 1, wherein the full dovetail profile forms tabs extending radially inward from an outer wall of the sealing groove.

3. The sealing groove of claim 1, wherein the full dovetail profile forms tabs extending radially outward from an inner wall of the sealing groove.

4. The sealing groove of claim 1, wherein a wall of the dovetails is at a 60 degree angle from a bottom surface of the dovetails.

5. A surface having a sealing groove, comprising:
  a surface having a sealing groove formed therein, the sealing groove configured to accept an elastomeric seal, the sealing groove comprising:
    a first portion having a full dovetail profile and at least one second portion having a half dovetail non-continuous profile, the at least one second portion connects the first portion along a periphery direction of the sealing groove.

6. The surface of claim 5, wherein the full dovetail profile forms tabs extending radially inward from an outer wall of the sealing groove.

7. The surface of claim 6, wherein the tabs are along the outer wall of the sealing groove at 12 equally spaced locations.

8. The surface of claim 6, wherein a transition in the outer wall to and from the tabs has a radius of 1 mm.

9. The surface of claim 5, wherein the full dovetail profile forms tabs extending radially outward from an inner wall of the sealing groove.

10. The surface of claim 5, wherein the full dovetail profile forms tabs extending radially outward from an inner wall of the sealing groove and radially inward from an outer wall of the sealing groove.

11. The surface of claim 5, wherein a wall of the dovetails is at a 60 degree angle from a bottom surface of the dovetails.

12. The surface of claim 5, wherein a narrow portion of the full dovetail profile has an opening of 4.58 mm and a narrow portion of the half dovetail non-continuous profile has an opening of 5.71 mm.

13. A vacuum processing chamber, comprising:
a chamber body includes a bottom, and side walls, a lid assembly moveable between an open and a closed position; and
a sealing groove formed on a surface in one of the lid assembly and the chamber body, the sealing groove configured to accept an elastomeric seal wherein the sealing groove comprises:
a first portion having a full dovetail profile and at least one second portion having a half dovetail profile, the at least one second portion connects the first portion along a periphery direction of the sealing groove.

14. The vacuum processing chamber of claim 13, wherein the full dovetail profile forms tabs extending radially inward from an outer wall of the sealing groove.

15. The vacuum processing chamber of claim 14, wherein the tabs are along the outer wall of the sealing groove at 12 equally spaced locations.

16. The vacuum processing chamber of claim 14, wherein a transition in the outer wall to and from the tabs has a radius of larger than 1 mm.

17. The vacuum processing chamber of claim 13, wherein the full dovetail profile forms tabs extending radially outward from an inner wall of the sealing groove.

18. The vacuum processing chamber of claim 13, wherein a wall of the dovetails is at a 60 degree angle from a bottom surface of the dovetails.

19. The vacuum processing chamber of claim 18, wherein the bottom surface of the dovetails is formed 4.17 mm below the surface having the sealing groove formed therein.

20. The vacuum processing chamber of claim 13, wherein a narrow portion of the full dovetail profile has an opening of 4.58 mm and a narrow portion of the half dovetail profile has an opening of 5.71 mm.

* * * * *